(12) United States Patent
Raychaudhuri

(10) Patent No.: US 6,762,637 B2
(45) Date of Patent: Jul. 13, 2004

(54) EDGE-TRIGGERED D-FLIP-FLOP CIRCUIT

(75) Inventor: Arindam Raychaudhuri, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/946,994

(22) Filed: Sep. 4, 2001

(65) Prior Publication Data

US 2002/0047736 A1 Apr. 25, 2002

(30) Foreign Application Priority Data

Sep. 4, 2000 (EP) .............................. 00119139

(51) Int. Cl.[7] .............................. H03K 3/356
(52) U.S. Cl. .................... 327/202; 327/203
(58) Field of Search ................. 327/218, 201, 327/202, 203, 208, 210, 211; 371/22.31

(56) References Cited

U.S. PATENT DOCUMENTS

| | | | | |
|---|---|---|---|---|
| 3,812,384 A | * | 5/1974 | Skorup | 307/238 |
| 5,784,384 A | | 7/1998 | Maeno | 371/22.31 |
| 5,889,709 A | * | 3/1999 | Fukuda | 327/143 |
| 5,905,393 A | * | 5/1999 | Rinderknecht et al. | 327/202 |
| 6,333,656 B1 | * | 12/2001 | Schober | 327/202 |

FOREIGN PATENT DOCUMENTS

| | | |
|---|---|---|
| DE | 196 36 083 A 1 | 3/1997 |
| EP | 0 862 269 A2 | 9/1998 |
| JP | 08 097 685 A | 4/1996 |
| JP | 09 270 677 A | 10/1997 |
| JP | 411284493 | * 10/1999 |
| JP | 2000 022 503 | 1/2000 |
| KR | 1997-0019072 | 4/1997 |
| TW | 328663 | 3/1998 |

OTHER PUBLICATIONS

Tietze et al.: "Semiconductor Circuit Technology". vol. 10, "Schaltwerke (Sequentielle Logik)"—"Switch Mechanism (sequential logic)", Chapter 10;—"Intergrierte Flip-Flops"—"Integriated Flip–Flops", Chapter 10.1; "Dualzähler"—"Binary Counter", Chapter 10.2; pp. 236–241.

* cited by examiner

*Primary Examiner*—Dinh T. Le
(74) *Attorney, Agent, or Firm*—Laurence A. Greenberg; Werner H. Stemer; Ralph E. Locher

(57) ABSTRACT

The circuit forms an edge-triggered D-Flip-Flop with a master/slave configuration. The master circuit has only one master switch controlled by a clock signal and followed by a first inverter. The slave circuit has a slave switch followed by a second inverter and a regenerative feedback-loop. The master and slave switches can easily be realized using n-MOS-transistors instead of transmission gates, thus achieving small chip area. The Flip-Flop can easily be amended by set and reset devices and it is suitable for mass applications such as memory and microprocessor chips.

2 Claims, 4 Drawing Sheets

EDGE-TRIGGERED D-FLIP-FLOP CIRCUIT

FIELD OF THE INVENTION

The present invention relates to an edge-triggered D-Flip-Flop circuit, having a master circuit and a slave circuit.

The D-Flip-Flop, also known as data-Flip-Flop, is a fundamental circuit block in digital logic circuits. An edge-triggered D-Flip-Flop with master-slave-configuration is presented, for example, in Tietze, Schenk: *Halbleiter-Schaltungstechnik*, 10$^{th}$ edition, pages 237–40.

Data-Flip-Flops have a wide field of application, including memories, especially DRAMS, microprocessors, VLSI circuits, and so on. In these fields, low power consumption, high speed and smallest possible chip area are the main targets of the present chip manufacturing industry.

Present implementations of master-slave D-Flip-Flops normally include CMOS transmission gates, inverters and other logic gates.

A master-slave D-Flip-Flop having a master block followed by a slave block, both of which comprise switches and latches, is presented in U.S. Pat. No. 5,784,384 (see German published patent application DE 196 36 083 A1). The arrangement described therein comprises switches implemented as transmission-gates in order to achieve determined voltage levels representing logic 0 and 1, respectively.

These master-slave D-Flip-Flop implementations require a relatively large chip area, which is especially disadvantageous when used in mass applications such as memory chips or microprocessor chips.

SUMMARY OF THE INVENTION

It is accordingly an object of the invention to provide an edge-triggered data flip-flop using a master-slave-configuration, which overcomes the above-mentioned disadvantages of the heretofore-known devices and methods of this general type and which can be integrated requiring less chip area and is suitable for mass applications such as memories or microprocessors.

With the foregoing and other objects in view there is provided, in accordance with the invention, an edge-triggered D-Flip-Flop circuit, comprising:

a master circuit having a data input, a master switch in the form of an n-channel metal oxide semiconductor field-effect transistor controlled by a clock signal and connected with one end to the data input terminal, and a first inverter having an input terminal connected to the master switch and an output terminal; and a slave circuit having a slave switch in the form of an n-channel metal oxide semiconductor field-effect transistor controlled by the clock signal and connected to the output terminal of the first inverter, a second inverter having an input terminal connected to the slave switch and an output terminal, and a feedback-loop comprising a feedback-switch and a third inverter connected between the input terminal and the output terminal of the second inverter.

In other words, the objects of the invention are achieved by an edge-triggered D-Flip-Flop circuit having a master circuit and a slave circuit. The master circuit comprises a master switch controlled by a clock signal and connected with one end to a data input terminal and comprising a first inverter having an input terminal and an output terminal, the input terminal being connected to the master switch; and the slave circuit comprises a slave switch controlled by the clock signal and connected to the output terminal of the first inverter, a second inverter having an input terminal and an output terminal, the input terminal being connected to the slave switch, and a feedback-loop comprising a feedback-switch and a third inverter and being connected to the second inverter input and output terminals. Importantly, the master switch and the slave switch are n-channel MOSFETs (metal oxide semiconductor field-effect transistors).

Advantageously, the feedback-loop is a regenerative feedback-loop.

The Flip-Flop circuit described saves a considerable amount of chip area and shows improved performance especially when used extensively in memory or microprocessor circuits.

By using N-MOSFETS instead of transmission gates, the circuit arrangement given is faster and appropriate for higher frequencies.

The inverters, especially the first inverter, may serve as a level-shifter to provide determined voltage levels for logic 0 and 1, respectively.

In addition, the circuit is easily adaptable to lower supply voltages such as 1.2 or 1.4 volts by replacing the N-MOS switches with low threshold voltage N-MOSFETS.

In accordance with an added feature of the invention, means are provided to set and reset an information stored in the slave circuit. In some applications, it is preferable to have the possibility to set and reset the information stored in the slave circuit and therefore provide direct possibility to influence the state of the output terminal of the slave circuit or the D-Flip-Flop circuit respectively.

In accordance with an additional feature of the invention, a set switch is provided with one end connected to the input terminal of the second inverter and another end connected to ground potential.

In accordance with another feature of the invention, a reset switch is provided having one end connected to the output terminal of the second inverter, and another end connected to ground potential. These set and reset means provided allow an implementation of a master-slave D-Flip-Flop having set and reset input terminals with very small chip area.

In accordance with a further feature of the invention, the master and slave switches are pass-transistors. Pass-transistors require very low chip area, and therefore the positive edge-triggered D-Flip-Flop circuit can be integrated with very low chip area.

In accordance with a concomitant feature of the invention, the pass-transistors are MOSFETs. Preferably, MOSFETs of an enhancement type can be used. Advantageously, the set, reset and feedback-switches are also implemented using enhancement type MOSFETs.

Other features which are considered as characteristic for the invention are set forth in the appended claims.

Although the invention is illustrated and described herein as embodied in a Edge-Triggered D-Flip-flop Circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
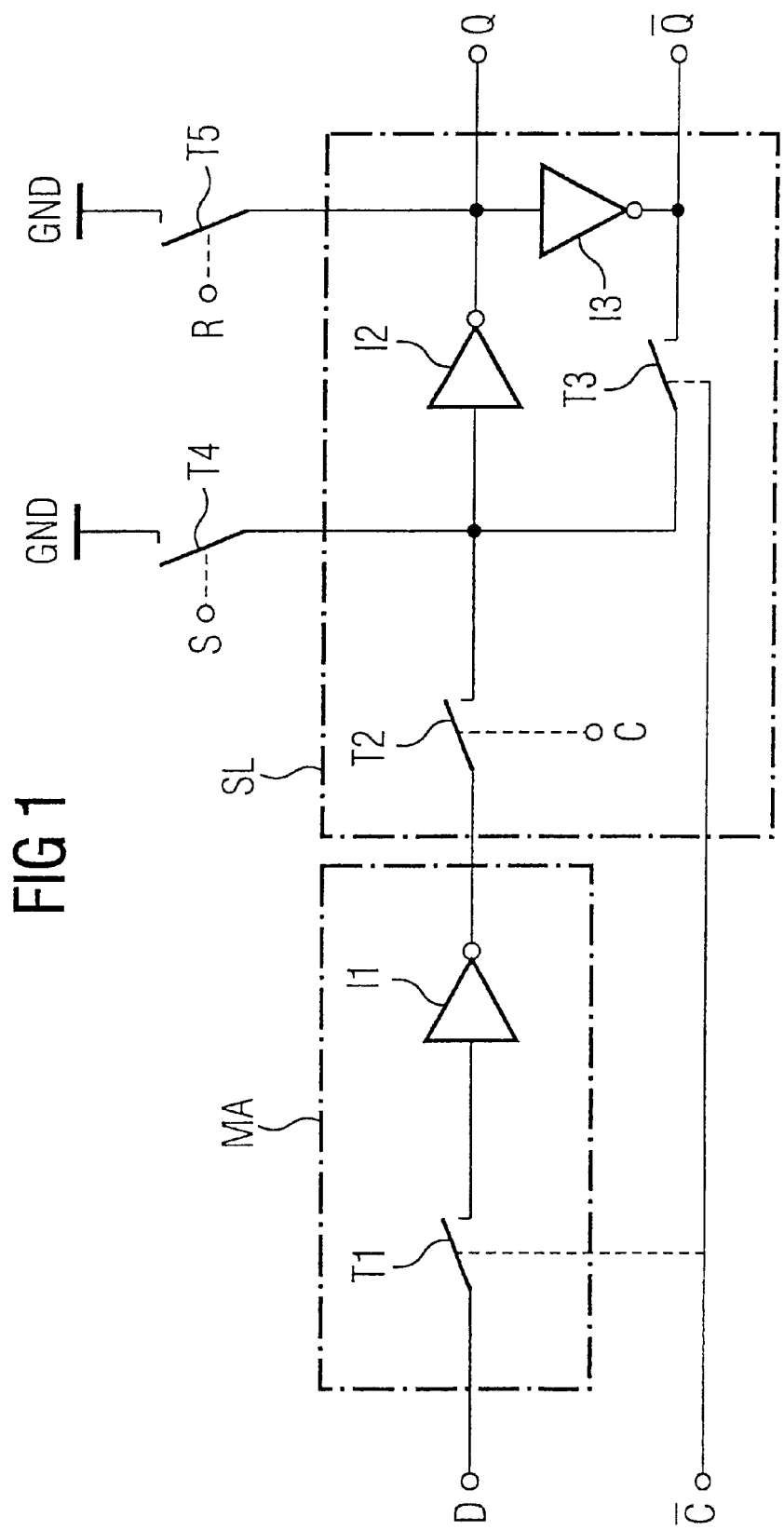
FIG. 1 is a block circuit diagram of an embodiment of a positive edge-triggered D-Flip-Flop according to the present invention.

Referring now to the figures of the drawing in detail and first, particularly, to FIG. 1 thereof, there is shown a positive edge-triggered D-Flip-Flop circuit based on the present invention having a master unit MA and a slave unit SL following the master unit MA. The master unit has an input terminal D, the slave unit SL has output terminals Q and an inverted output terminal /Q.

A clock signal and an inverted signal of the clock signal can be applied to non-inverted and inverted clock signal in-puts C, /C of the D-Flip-Flop respectively.

The master circuit MA comprises a first pass-transistor T1, realizing the master switch with its input terminal connected to the input terminal D of the Flip-Flop, and its output terminal connected to an input terminal of a first inverter I1. The control terminal of the first pass-transistor T1 is connected to the inverted clock signal input /C.

The master circuit MA is formed using only a single pass-transistor T1. The first inverter I1 is used to shape the output signal of the master circuit MA.

The slave circuit SL comprises a second pass-transistor T2 realizing the slave switch and connected with its input terminal to the output terminal of the first inverter I1 and with its output terminal to an input terminal of a second inverter I2. For controlling the second pass-transistor T2, the control terminal of the second transistor T2 is connected to the non-inverted clock signal input terminal C. The second inverter I2 has an output terminal which is connected to the output terminal Q of the Flip-Flop. To provide an inverted output terminal /Q, a third inverter I3 is connected with its input terminal to the output terminal of inverter I2. A third pass-transistor T3 is connected in series with the third inverter I3, realizing a regenerative feedback loop in the slave unit SL. The feedback loop in the slave circuit holds stored data in the slave unit, while the master unit MA can capture new data at its input terminal D. The control terminal of the third transistor T3 is connected to the inverted clock signal input terminal /C.

The flip-flop circuit according to FIG. 1 furthermore features set and reset options using a set switch T4 and a reset switch T5. The set switch T4 is connected to the input terminal of the second inverter I2 and to ground potential GND. The reset switch T5 is connected to the output terminal of the second inverter I2 and to ground potential GND. The set and reset switches T4, T5 are with their control terminals connected to set and reset input terminals S, R.

The D-Flip-Flop according to the block diagram shown in FIG. 1 not only provides high speed and low power consumption, but it is also integrable using very low chip area by using a minimum number of pass-transistors.

Figure 2:
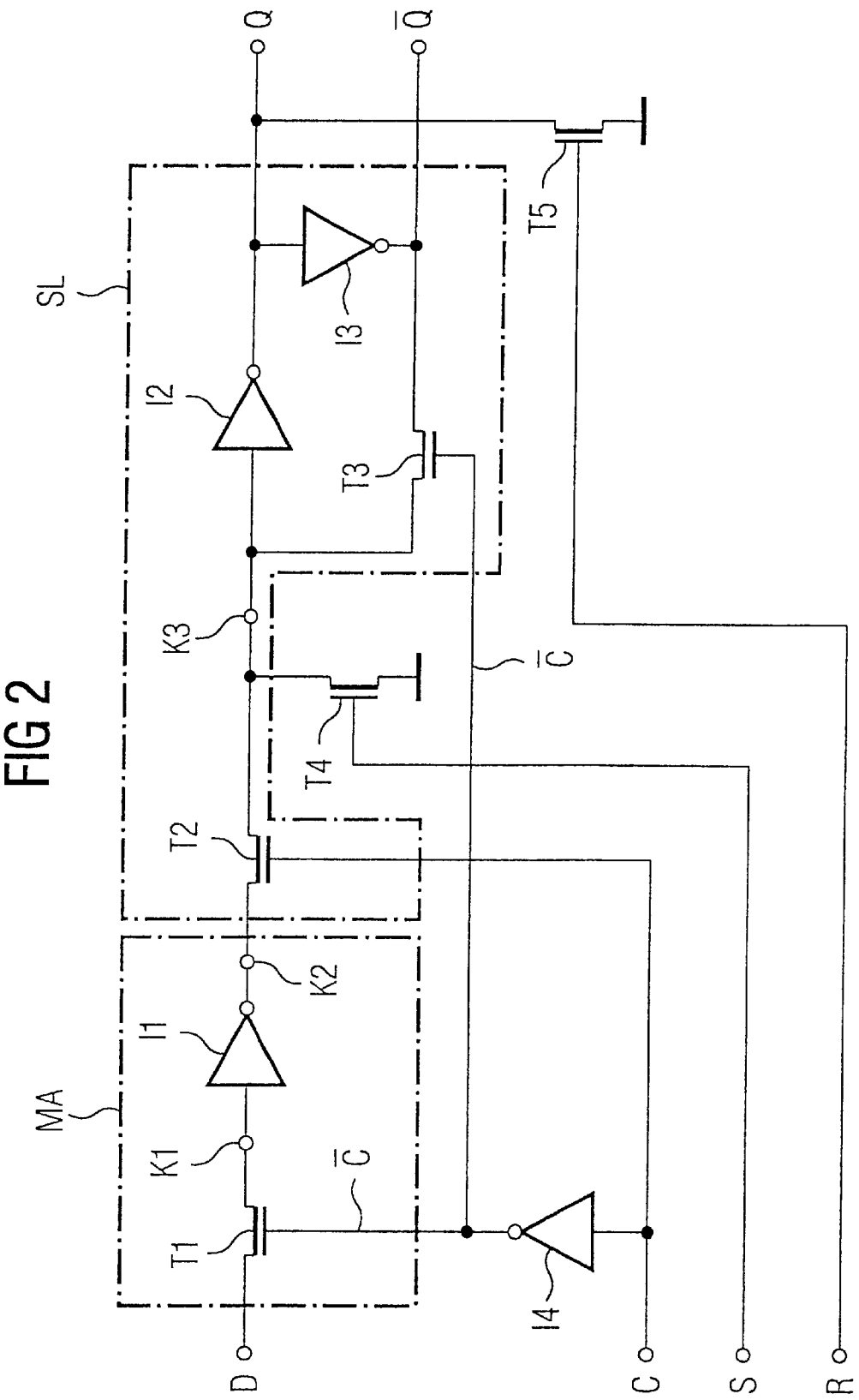
FIG. 2 is a circuit diagram of an embodiment of a positive edge-triggered D-Flip-Flop according to the present invention.

Referring now to FIG. 2, there is shown a circuit schematic according to FIG. 1, using insulated gate transistors, preferably MOSFETs of an enhancement type, to realize the master and slave switches T1, T2, the feedback switch T3, as well as the set and reset switches T4, T5. Furthermore, the circuit diagram according to FIG. 2 provides internal circuit nodes K1, K2 and K3 with the internal circuit node K1 being connected to the input terminal of the first inverter I1, the internal circuit node K2 being connected to the output terminal of inverter I1, and the internal circuit node K3 being connected to the input terminal of the inverter I2. The inverted clock signal input terminal /C is derived from the non-inverted clock signal input terminal C, using a fourth inverter T4.

The positive edge-triggered D-Flip-Flop circuit according to FIG. 2 can be powered by using a low voltage of 2.25 volts. The minimum set and reset pulse width of the D-Flip-Flop described is 1 ns. The minimum set-up time for data input at the input terminal D with respect to the clock rising edge is 500 ps, while the minimum hold time for data input with respect to the clock rising edge is 0 ps. The clock rising edge to valid data output delay is 240 ps for logic 1 data output, and 580 ps for logic 0 data output.

A minimum number of transistors and inverters is required to realize the flip-flop circuit according to FIG. 2. Thus, it can be built with low chip area and it requires low power. Therefore, it is for example suitable for mass applications such as memories or processor chips.

Figure 3:
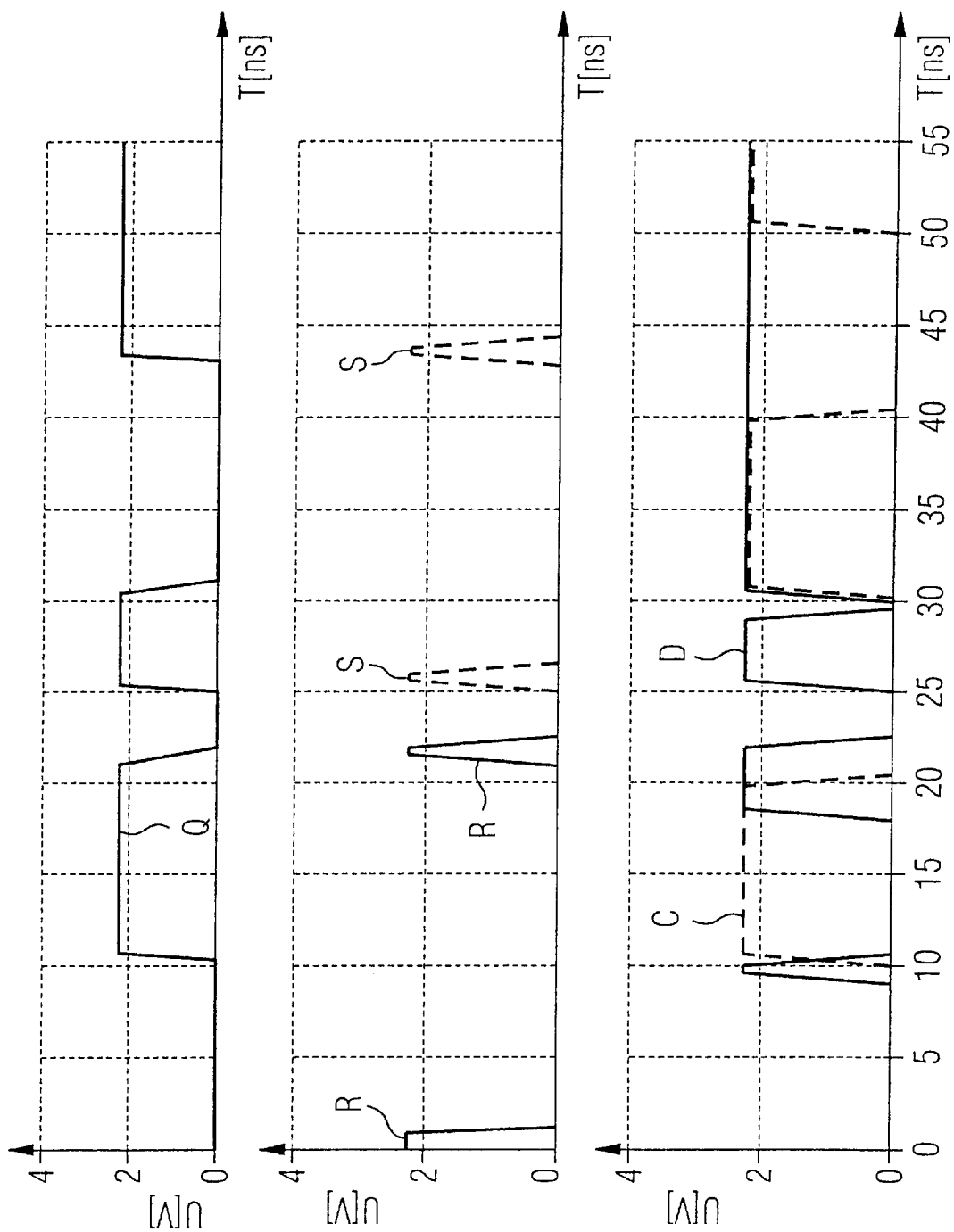
FIG. 3 is a signal voltage chart, graphed over time, of the input and output terminals according to the circuits given in FIGS. 1 and 2.

The voltage over time diagrams shown in FIG. 3 of the input terminals D, C, R, S, and output terminal Q provide a more precise functional description of the D-Flip-Flop according to FIG. 1 and FIG. 2. While the clock input signal C is high, a signal applied to data input terminal D has no effect on the output Q. On the other hand, while C is low, the master circuit acquires the applied data at input D and, at the moment of the rising edge of clock signal C, makes it transparent to output terminal Q. A signal applied to data input D at times different from the rising edge of clock signal C has no effect on the output Q. The set and reset options S, R though directly and with no significant delay affect the state of the signal at output terminal Q.

Figure 4:
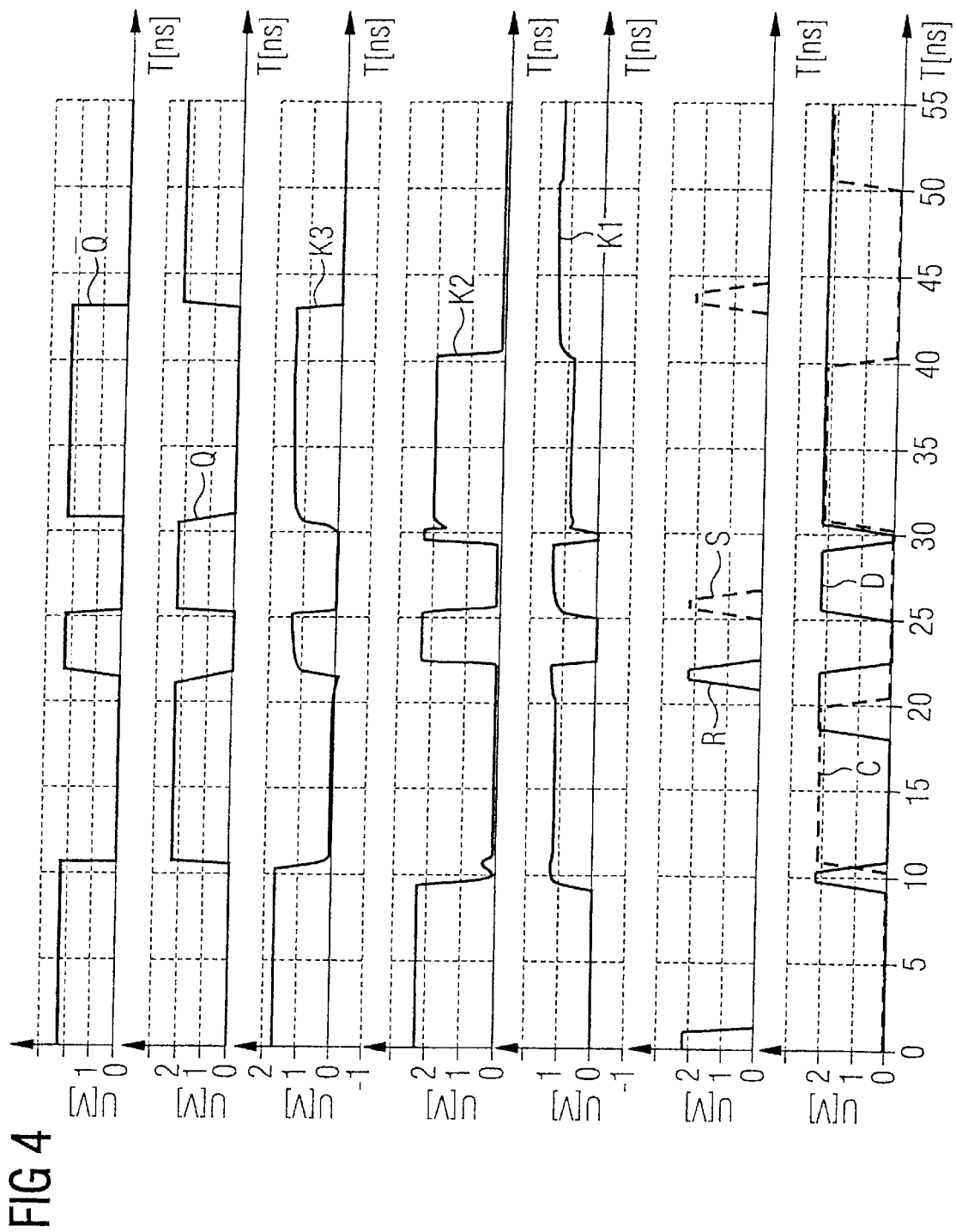
FIG. 4 is a signal voltage chart showing the voltages of the input and output signals over time and additional voltages over time at internal circuit nodes of the circuit of FIG. 2.

FIG. 4 is an amended diagram as compared to FIG. 3. The latter includes the signals at the inverted output terminal /Q and the internal circuit nodes K1, K2, K3 given in FIG. 2. It is evident that the first inverter I1 sharpens the signal edges of its input signal at internal circuit node K1. The inverted signal K2 not only shows greater magnitude, but also reduces spurious effects and absolutely has defined high or low states.

I claim:

1. An edge-triggered D-Flip-Flop circuit, comprising:
   a master circuit having a data input terminal, a master switch controlled by a clock signal and connected with one end of said data input terminal, and a first inverter having an input terminal connected to said master switch and an output terminal, said master circuit having no feedback structure;
   a slave circuit having a slave switch controlled by said clock signal and connected to said output terminal of said first inverter, a second inverter having an input terminal connected to said slave switch and an output terminal, and a feedback-loop including a feedback-switch and a third inverter connected between said input terminal and said output terminal of said second inverter;
   set and reset inputs for respectively setting and resetting information stored in said slave circuit;
   a set switch connected between said input terminal of said second inverter and a ground potential;

a reset switch connected between said output terminal of said second inverter and the ground potential;

each of said master switch and said slave switch being a single n-channel metal oxide semiconductor field-effect transistor (MOSFET), said master switch n-channel MOSFET having a first source/drain-terminal connected to said data input and a second source/drain-terminal connected to said input terminal of said first inverter; and said set switch and said reset switch being n-channel MOSFETs.

2. The D-Flip-Flop circuit according to claim 1, wherein said master switch and slave switch are enhancement type MOSFETs.

* * * * *